United States Patent [19]

Mino et al.

[11] Patent Number: 5,406,266

[45] Date of Patent: Apr. 11, 1995

[54] RESIDUAL CAPACITY DISPLAYING DEVICE

[75] Inventors: Takayuki Mino; Eiji Satsuma, both of Hyogo, Japan

[73] Assignee: Sanyo Electric Co., Ltd., Osaka, Japan

[21] Appl. No.: 269,620

[22] Filed: Jul. 1, 1994

Related U.S. Application Data

[63] Continuation of Ser. No. 904,269, Jun. 25, 1992, abandoned.

[30] Foreign Application Priority Data

Aug. 6, 1991 [JP] Japan .................. 3-061909 U

[51] Int. Cl.6 .................................. G08B 21/00
[52] U.S. Cl. .................................... 340/636; 320/48; 324/435
[58] Field of Search .................. 340/636; 320/48; 324/435

[56] References Cited

U.S. PATENT DOCUMENTS

| | | | |
|---|---|---|---|
| 4,229,688 | 10/1980 | Knox et al. | 320/48 |
| 4,380,726 | 4/1983 | Sado et al. | 340/636 |
| 4,544,910 | 10/1985 | Hoberman | 340/636 |
| 4,678,998 | 7/1987 | Muramatsu | 320/48 |
| 4,743,831 | 5/1988 | Young | 320/48 |
| 5,032,825 | 7/1991 | Kuznicki | 320/48 |
| 5,043,651 | 8/1991 | Tamura | 320/48 |
| 5,325,041 | 6/1994 | Briggs | 340/636 |

FOREIGN PATENT DOCUMENTS

| | | |
|---|---|---|
| 61-209371 | 9/1986 | Japan . |
| 62-141934 | 6/1987 | Japan . |
| 62-175680 | 8/1987 | Japan . |

Primary Examiner—John K. Peng
Assistant Examiner—Edward Lefkowitz
Attorney, Agent, or Firm—Finnegan, Henderson, Farabow, Garrett & Dunner

[57] ABSTRACT

A residual capacity displaying device which discriminates whether or not a battery is deteriorated, and display the result of the discrimination. The residual capacity displaying device for a battery pack includes a current detecting unit for detecting current flowing to and from a battery pack. A battery identifying unit identifies the kind of the battery pack, and an arithmetic unit calculates the capacity of the battery pack according to the output of the current detecting unit and the time thereof. The dischargeable capacity of the battery pack is stored according to the output of the battery identifying unit. Also, the capacity of the battery pack which is discharged is compared until the voltage of the battery pack reaches a predetermined voltage value with the dischargeable capacity. When the result of comparison reaches a predetermined value, LEDs display the fact that the battery pack has been deteriorated.

5 Claims, 3 Drawing Sheets

RESIDUAL CAPACITY DISPLAYING DEVICE

This application is a continuation of application Ser. No. 07/904,269, filed Jun. 25, 1992, now abandoned.

BACKGROUND OF THE INVENTION

This invention relates to a residual capacity displaying device for calculating and displaying the residual capacity of a battery pack used as a power source for a VTR (video tape recorder) or the like.

A device for displaying the residual capacity of a battery pack has been disclosed, for instance, by Japanese Patent Unexamined Publication Sho-61-209371/(1986). In the conventional device, the residual capacity displaying circuit is so designed that charging or discharging current of a battery is detected and subjected to integration or subtraction, thereby to calculate and display the residual capacity of the battery. The residual capacity displaying circuit further operates as follows: When, after the battery is connected to an electrical device, and can no longer drive the electrical device, because the residual capacity of the battery is 0%, the voltage of the battery is read as a reference value. When the voltage of the battery becomes lower than the reference value thus read, the battery residual capacity value in an arithmetic control section is reset to zero (0). Hence, it is possible to correct the difference between the calculated capacity value and the actual capacity value, which may occur when the battery is repeatedly charged and discharged.

When a memory effect occurs with the battery, or when the battery is deteriorated being used for a long time, the capacity of the battery is lowered as compared with its initial capacity. Therefore, the voltage of the battery reaches the above-described reference value earlier, and the discharging time is shortened accordingly. And, similarly as in the above-described case, the battery residual capacity value in the arithmetic control section is reset. In this case, although the battery has been deteriorated, the battery residual capacity value is displayed accurately. Hence, the user may use the battery repeatedly without knowing the fact that the battery has been deteriorated. If the deteriorated battery is used for an electrical device such as for instance a VTR, then it is impossible for the battery to drive the electrical device for a required period of time, and the operation of the electrical device may be stopped unexpectedly.

SUMMARY OF THE INVENTION

Accordingly, an object of this invention is to eliminate the above-described difficulties accompanying a conventional residual capacity displaying device. More specifically, an object of the invention is to provide a residual capacity displaying device which determines whether or not a battery is deteriorated, and displays the result of determination.

The foregoing object of the invention has been achieved by the provision of a residual capacity displaying device which is detachably connected to a rechargeable type battery pack, to display the residual capacity of the battery pack, which device comprises: a current detector for detecting current flowing to and from the battery pack; battery identifying unit for identifying the kind of the battery pack; arithmetic unit for calculating the capacity of the battery pack according to an output of the current detector and the detecting time, and storing the dischargeable capacity of the battery pack according to an output of the battery identifying unit, and comparing the capacity of the battery pack which is discharged until the voltage of the battery pack reaches a predetermined voltage value with the dischargeable capacity; and displaying unit for displaying, when the result of comparison reaches a predetermined value, the fact that the battery pack has been deteriorated.

In the residual capacity displaying device according to the present invention, the battery identifying unit identifies the kind of the battery pack, and the arithmetic unit stores the dischargeable capacity of the battery pack according to its kind. The arithmetic unit further operates to calculate the capacity of the battery pack according to the integration of the output of the current detector and the time thereof. Furthermore, the arithmetic unit compares the capacity of battery pack which is discharged until the voltage of the battery pack reaches the predetermined voltage value with the dischargeable capacity. When the result of comparison reaches the predetermined value, the display unit displays the fact that the battery pack has been deteriorated. Thus, the user will detect that all the dischargeable capacity of the battery pack which is predetermined according to its kind cannot be used; that is, it has been deteriorated.

BRIEF DESCRIPTION OF THE DRAWING(S)

DETAILED DESCRIPTION OF THE PREFERRED EMBODIMENT

Figure 1:
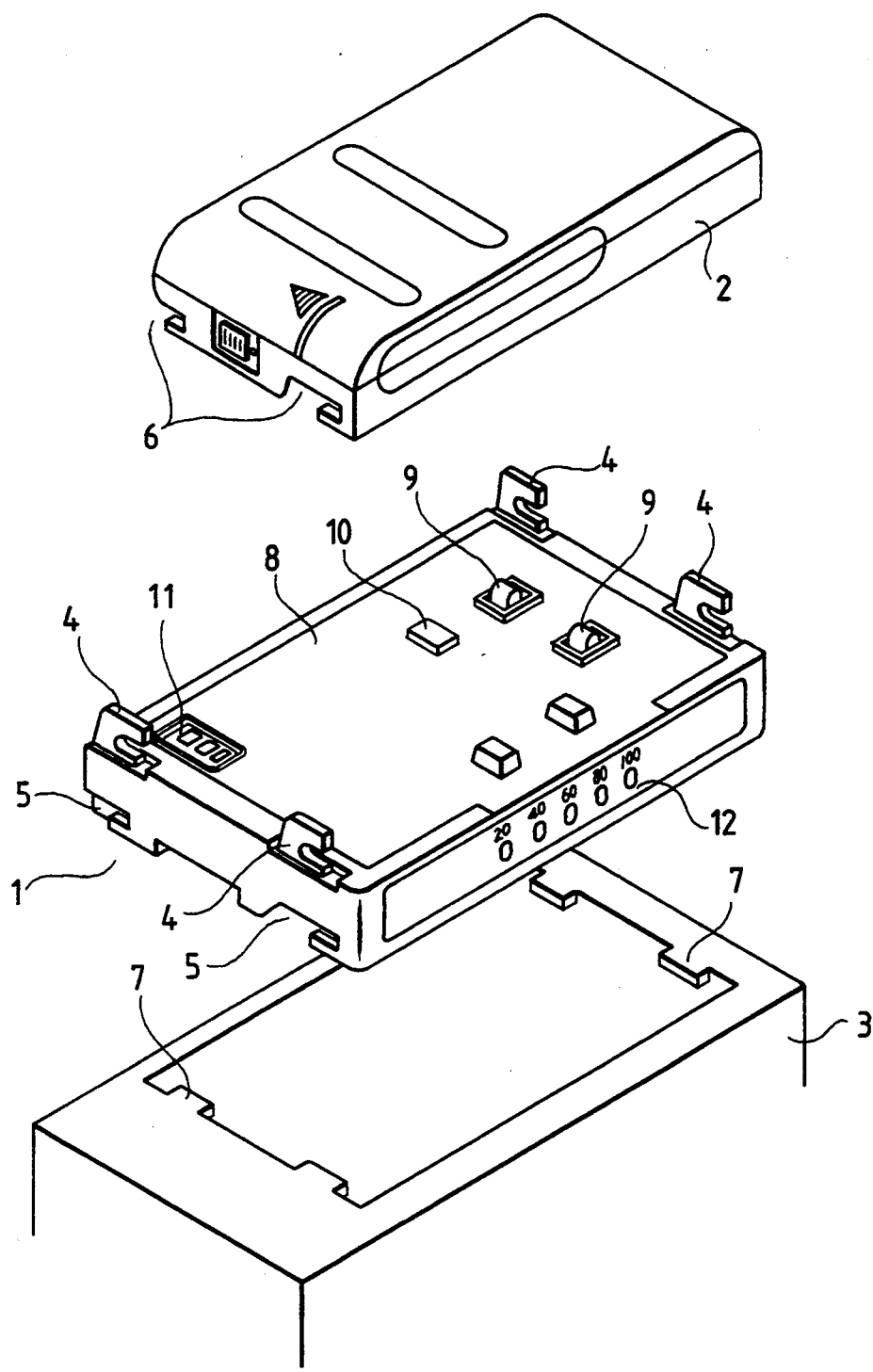
FIG. 1 is an exploded perspective view showing a battery pack, a residual capacity displaying device, and a VTR.

One preferred embodiment of this invention will be described with reference to the accompanying drawings.

In FIG, 1, reference numeral 1 designates a residual capacity displaying device according to the invention. The device 1 is disposed between a battery pack 2 and a VTR 3. The device 1 has engaging pawls 4 and engaging recesses 5. The device 1 is combined with the battery pack 2 with the engaging pawls 4 engaged with engaging recesses 6 of the battery pack 2, and the device 1 is combined with the VTR 3 with the engaging recesses 5 engaged with engaging pawls 7 of the VTR 3. That is, the device 1 together with the battery pack 2 is fixedly mounted on the VTR 3. The device 1 has a mounting surface 8 on which the battery pack 2 is mounted. A pair of connecting terminals 9 are provided on the mounting surface 8 of the device. In addition, protrusions 10 are formed on the mounting surface 8 in such a manner that they are engaged with recesses formed in the battery pack 2 when the latter 2 is mounted on the device 1. Furthermore, battery identifying unit 11 for identifying the kind of a battery is provided in the mounting surface 8 of the device 1, so that the kind of the battery is identified. Additionally, five LEDs (light emitting diodes) 12 are embedded, as display means, in one side wall of the residual capacity displaying device 1. That is, the device 1 is so designed as to transmit power from the battery pack 2 to the VTR 3, and to display the residual capacity of the battery pack 2 with the latter 2 as a drive source.

Figure 2:
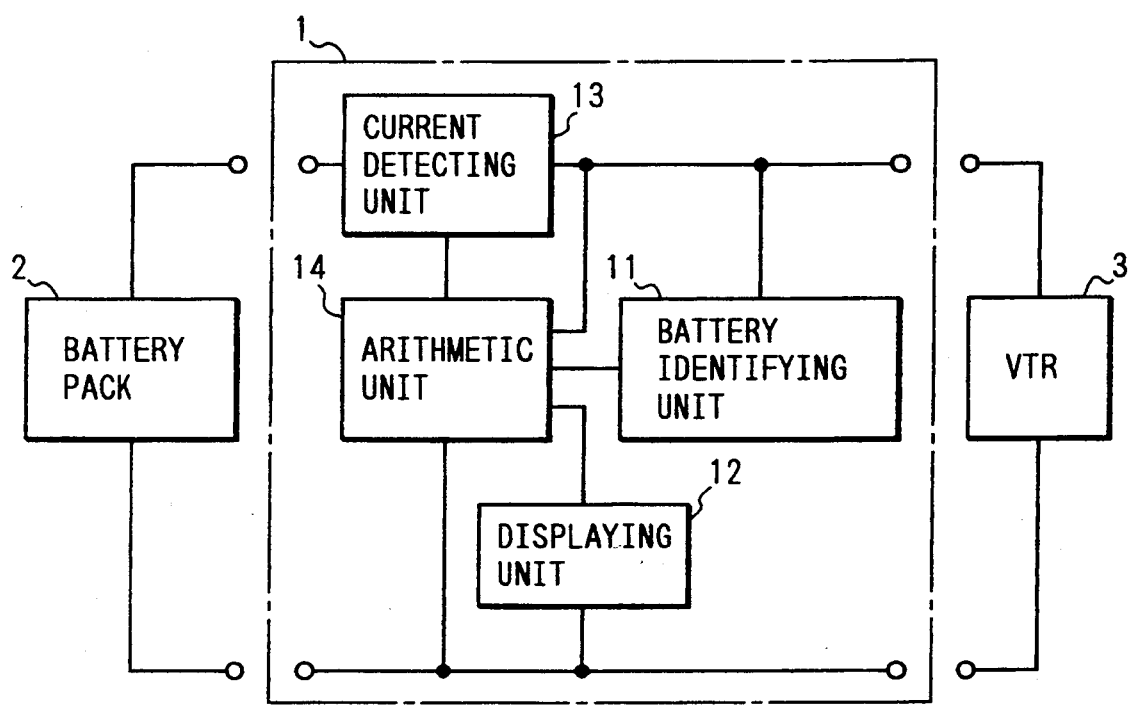
FIG. 2 is a block diagram showing the arrangement of the residual capacity displaying device, and the electrical connection of the device to the battery pack and the VTR.
Figure 3:
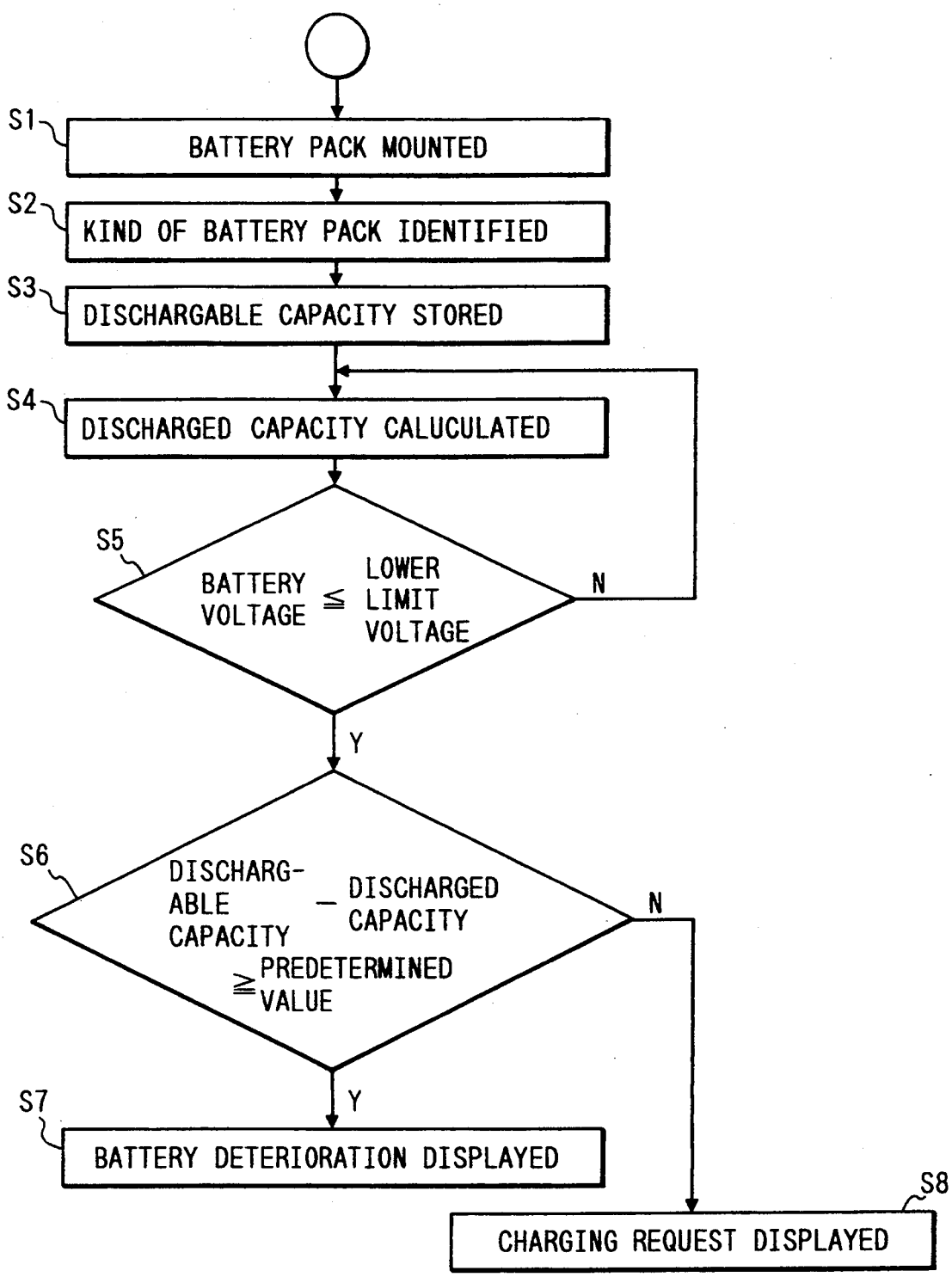
FIG. 3 is a flowchart showing an operation of the residual capacity displaying device according the present invention.

The residual capacity displaying device 1, as shown in FIG. 2, comprises: current detecting unit 13 serially connected between the battery pack 2 and the VTR 3; displaying unit 12 including the LEDs; the battery identifying unit 11; and arithmetic unit 14 for calculating the residual capacity of a battery from the output of the current detecting unit 13. The current detecting unit 13 detects current flowing from or to the battery pack 2, and applies the value of current thus detected to the arithmetic unit 14. The arithmetic unit 14 utilizes the product of the value of current thus detected and the period of time for which the current flows, to perform integration or subtraction of the amount of charge or discharge of the battery pack. The output, or the result of calculation, of the arithmetic unit 14 is displayed by the LEDs 12. The battery identifying means 11 is made up of a slide knob. The operator operates the battery identifying unit to identify the kind of the battery used. In this operation, the arithmetic means 14 stores the capacity of the battery pack 2 which is dischargeable to the VTR 3, corresponding to the nominal capacity thereof. The operation of the residual capacity displaying device is shown in the flowchart of the FIG. 3.

When the VTR 3 is driven with the battery pack connected through the residual capacity displaying unit 1, the battery pack 2 is discharged, while the displaying unit 1 calculates and displays the residual capacity of the battery pack 2. In this operation, the LEDs 12 display the dischargeable residual capacity of the battery pack 2 in five steps, 20%, 40%, 60%, 80% and 100%. That is, in the case where the battery pack has been fully charged, the rightmost of the LEDs 12 (in FIG. 1) is turned on. Thereafter, when the battery pack is discharged 20%, the second LED from the right most is turned on; when it is discharged further 20%, the third LED is turned on, and so forth.

As the battery pack is discharged, its voltage is decreased. When the voltage of the battery pack reaches a lower threshold value with which the VTR 3 is still operable, the VTR 3 detects it, to electrically disconnect the battery pack therefrom. The lower threshold value has been set in the residual capacity displaying device 1 in advance. The arithmetic unit 14 compares the capacity of the battery discharged until its voltage has reached the lower threshold value with the above-described dischargeable capacity (step S5). When it is determined that there is a predetermined difference between the two capacities, namely, the discharged capacity and the dischargeable capacity (step S6); that is, when the capacity which the battery is originally to have is not provided, for instance all the LEDs 12 are caused to flicker, to display the fact that the battery has been deteriorated (step S7). Thus, the user will detect that all the dischargeable capacity of the battery pack 2 which is predetermined according to its kind cannot be used; that is, it has been deteriorated.

If, in this case, the deterioration of the battery pack is due to the memory effect, then the battery pack can be recovered as follows: The battery pack is fully discharged, and then it is charged again. If the deterioration of the battery pack is due to other than the memory effect, for instance by the service life, it is the time the battery pack should be replaced with a new one. Thus, with the residual capacity displaying device, the battery pack can be handled effectively.

In the residual capacity displaying device of the invention, the discharged capacity of the battery is compared with its originally dischargeable capacity, and if the actually discharged capacity is insufficient, then it is displayed as the deterioration of the battery. Therefore, the user can visually detect that the battery has been deteriorated. Accordingly, this will eliminate the difficulty that the equipment connected to the battery is unexpectedly stopped. Furthermore the residual capacity displaying device displays the deterioration of the battery, and therefore it can be detected from the display that now it is the time the battery should be replaced with a new one. Those effects should be highly appreciated in practical use.

What is claimed is:

1. A display apparatus for indicating deterioration of a battery, comprising:
   current detection means for detecting a current flowing to and from the battery;
   deterioration detection means for detecting a deterioration of the battery including:
      storing means for storing a predetermined capacity of the battery;
      determining means for determining a recharged capacity of the battery from the current flowing over a period of time;
      voltage detection means for detecting a voltage of the battery being less than a predetermined voltage;
      calculation means for calculating a difference between the predetermined capacity and the recharged capacity of the battery in response to the voltage detection means; and
      judging means for judging whether a difference between the predetermined capacity and the recharged capacity of the battery exceeds a predetermined value; and
   display means for displaying a first notification when the difference exceeds the predetermined value, indicating battery deterioration, and a second notification, indicating that the battery should be recharged, when the difference does not exceed the predetermined value.

2. A deterioration display apparatus according to claim 1, further comprising means for determining battery type, and wherein the storing means stores the predetermined capacity in accordance with the battery type determined by the means for determining battery type.

3. A method for determining deterioration of a battery having a predetermined capacity comprising the steps of:
   detecting a voltage of the battery and a current flowing to and from the battery;
   determining a recharged capacity of the battery from the current flow over a unit of time;
   comparing, when the voltage is less than a predetermined lower voltage limit, the recharged capacity with the predetermined capacity of the battery;
   displaying a first notification when a difference between the predetermined capacity and the recharged capacity is greater than a predetermined value indicating battery deterioration and a second notification when the difference is less than the predetermined value indicating that the battery should be recharged.

4. The method according to claim 3, wherein the step of displaying a first notification further includes the substep of causing a plurality of light emitting diodes (LEDs) to flicker.

5. The method of claim 3, which further includes the step of determining battery type.

* * * * *